United States Patent
Tomiya et al.

[11] Patent Number: 6,094,564
[45] Date of Patent: Jul. 25, 2000

[54] MOBILE COMMUNICATION APPARATUS OPERABLE IN DIFFERENT FORMATS AND PAIRING I-F BAND PASS FILTER TYPE WITH I-F AMPLIFIER CHARACTERISTICS

[75] Inventors: Wataru Tomiya; Seiichi Yamaguchi; Fujio Sasaki, all of Yokohama; Hiroaki Kosugi, Osaka, all of Japan

[73] Assignee: Matsushita Electric Industrial Co., Ltd., Osaka, Japan

[21] Appl. No.: 08/797,862

[22] Filed: Feb. 10, 1997

[30] Foreign Application Priority Data

Apr. 8, 1996 [JP] Japan ................................. 8-110567

[51] Int. Cl.⁷ ............................... H04B 1/38; H04B 1/06
[52] U.S. Cl. ........................ 455/73; 455/266; 455/180.1; 455/189.1; 455/339
[58] Field of Search ..................................... 455/522, 266, 455/18.1, 188.1, 189.1, 190.1, 339, 340, 232.1, 234.1, 73

[56] References Cited

U.S. PATENT DOCUMENTS

| | | | |
|---|---|---|---|
| 5,010,400 | 4/1991 | Oto . | |
| 5,499,394 | 3/1996 | Kaatz et al. | 455/266 |
| 5,584,063 | 12/1996 | Brinkhaus | 455/266 |
| 5,602,847 | 2/1997 | Pagano et al. | 455/266 |
| 5,732,337 | 3/1998 | Wargnier et al. | 455/266 |
| 5,796,772 | 8/1998 | Smith et al. | 375/200 |

FOREIGN PATENT DOCUMENTS 7303059  11/1995  Japan .

*Primary Examiner*—Daniel S. Hunter
*Assistant Examiner*—Alan Gantt
*Attorney, Agent, or Firm*—Pollock, Vande Sande & Amernick

[57] ABSTRACT

A radio communication apparatus is designed for a plurality of different radio communication formats, one of which can be selected. The radio communication apparatus includes a fixed-gain IF amplifier and a variable-gain IF amplifier. One is selected out of the fixed-gain IF amplifier and the variable-gain IF amplifier as an effectively used IF amplifier in response to which of the radio communication formats is selected. The fixed-gain IF amplifier is selected as an effectively used IF amplifier when a narrow-band radio communication format is selected. The variable-gain IF amplifier is selected as an effectively used IF amplifier when a wide-band radio communication format is selected.

6 Claims, 3 Drawing Sheets

MOBILE COMMUNICATION APPARATUS OPERABLE IN DIFFERENT FORMATS AND PAIRING I-F BAND PASS FILTER TYPE WITH I-F AMPLIFIER CHARACTERISTICS

BACKGROUND OF THE INVENTION

1. Field of the Invention

This invention relates to a mobile radio communication apparatus.

2. Description of the Prior Art

Most of receiving sections in mobile radio communication transceivers are of superheterodyne types. There are various mobile radio communication formats using different modulation/demodulation types, respectively. Accordingly, a desired IF (intermediate frequency) pass bandwidth varies from format to format. Generally, an IF circuit in a receiving section which has an IF pass bandwidth chosen in conformity with one format can not suitably handle a signal of another format.

SUMMARY OF THE INVENTION

It is an object of this invention to provide an improved mobile radio communication apparatus.

A first aspect of this invention provides a radio communication apparatus for a plurality of different radio communication formats, one of which can be selected, the apparatus comprising a fixed-gain IF amplifier; a variable-gain IF amplifier; and means for selecting one out of the fixed-gain IF amplifier and the variable-gain IF amplifier as an effectively used IF amplifier in response to which of the radio communication formats is selected.

A second aspect of this invention provides a radio communication apparatus for a narrow-band radio communication format and a wide-band radio communication format, one of which can be selected, the apparatus comprising a fixed-gain IF amplifier; a variable-gain IF amplifier; means for selecting the fixed-gain IF amplifier as an effectively used IF amplifier when the narrow-band radio communication format is selected; and means for selecting the variable-gain IF amplifier as an effectively used IF amplifier when the wide-band radio communication format is selected.

A third aspect of this invention provides a radio communication apparatus for first and second radio communication formats which prescribe first and second desired IF pass bandwidths respectively, the first desired IF pass bandwidth being greater than the second desired IF pass bandwidth, the apparatus comprising a first IF band-pass filter, having a first predetermined pass bandwidth corresponding to the first desired IF pass bandwidth, for filtering a first IF signal of the first radio communication format; a second IF band-pass filter, having a second predetermined pass bandwidth corresponding to the second desired IF pass bandwidth, for filtering a second IF signal of the second radio communication format; a variable-gain IF amplifier connected to the first IF band-pass filter for amplifying an output signal of the first IF band-pass filter; a fixed-gain IF amplifier connected to the second IF band-pass filter for amplifying an output signal of the second IF band-pass filter; and means for selecting one out of the variable-gain IF amplifier and the fixed-gain IF amplifier as an effectively used IF amplifier.

DESCRIPTION OF THE PREFERRED EMBODIMENTS

Figure 1:
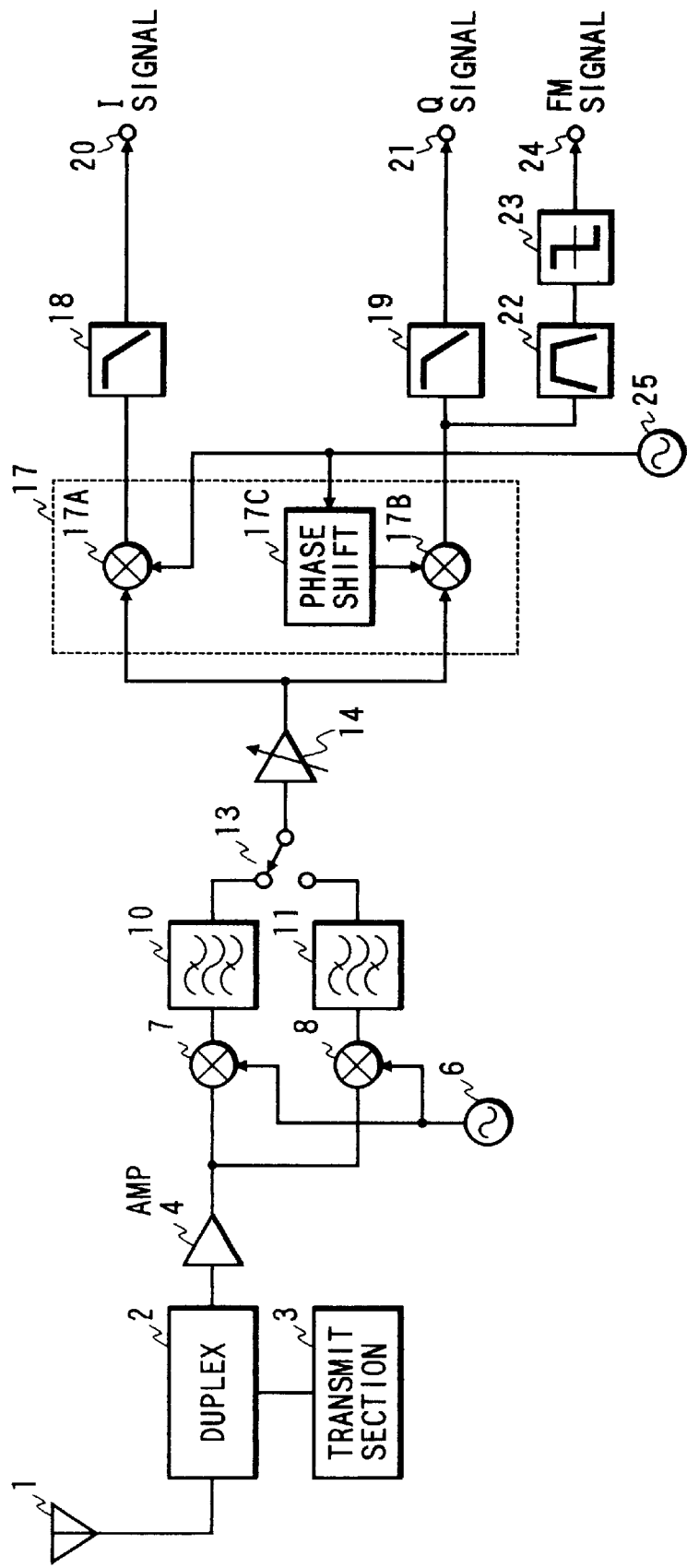
FIG. 1 is a block diagram of a background-art mobile radio communication transceiver.

A background-art mobile radio communication transceiver will be explained for a better understanding of this invention. FIG. 1 shows a background-art mobile radio communication transceiver which is not prior art to this invention.

The background-art mobile radio communication transceiver in FIG. 1 is provided with an antenna 1 connected to a duplexer 2. The duplexer 2 is connected to a receiving section and a transmitting section 3.

The receiving section includes an RF (radio frequency) preamplifier 4, a first local oscillator 6, mixers 7 and 8, IF (intermediate frequency) band-pass filters 10 and 11, a switch 13, and a variable-gain IF amplifier 14. The receiving section further includes a quadrature demodulator 17, low pass filters 18 and 19, output terminals 20 and 21, a band-pass filter 22, a limiter 23, an output terminal 24, and a second local oscillator 25.

The input terminal of the RF preamplifier 4 is connected to the duplexer 2. The output terminal of the RF preamplifier 4 is connected to first input terminals of the mixers 7 and 8. The output terminal of the first local oscillator 6 is connected to second input terminals of the mixers 7 and 8. The output terminal of the mixer 7 is connected to the input terminal of the IF band-pass filter 10. The output terminal of the IF band-pass filter 10 is connected to a first input side of the switch 13. The output terminal of the mixer 8 is connected to the input terminal of the IF band-pass filter 11. The output terminal of the IF band-pass filter 11 is connected to a second input side of the switch 13. An output side of the switch 13 is connected to the input terminal of the variable-gain IF amplifier 14.

The quadrature demodulator 17 follows the variable-gain IF amplifier 14. The quadrature demodulator 17 includes mixers 17A and 17B, and a phase shifter 17C. First input terminals of the mixers 17A and 17B are connected to the output terminal of the variable-gain IF amplifier 14. A second input terminal of the mixer 17A is connected to the output terminal of the second local oscillator 25. A second input terminal of the mixer 17B is connected to the output terminal of the phase shifter 17C. The input terminal of the phase shifter 17C is connected to the output terminal of the second local oscillator 25. The output terminal of the mixer 17A is connected to the input terminal of the low pass filter 18. The low pass filter 18 is followed by the output terminal 20 of the receiving section. The output terminal of the mixer 17B is connected to the input terminal of the low pass filter 19. The low pass filter 19 is followed by the output terminal 21 of the receiving section. The output terminal of the mixer 17B is also connected to the input terminal of the band-pass filter 22. The output terminal of the band-pass filter 22 is connected to the input terminal of the limiter 23. The limiter 23 is followed by the output terminal 24 of the receiving section.

The IF band-pass filter 10 has a pass bandwidth predetermined in conformity with a narrow-band mobile radio communication format "A". An example of the narrow-band mobile radio communication format "A" is an FM (frequency modulation) mobile radio communication format. The IF band-pass filter 11 has pass bandwidth predetermined in conformity with a wide-band mobile radio communication format "B" based on, for example, a spread spectrum technique. Accordingly, the pass bandwidth of the IF band-pass filter 10 is narrower than the pass bandwidth of the IF band-pass filter 11. Furthermore, a modulation/demodulation type used by the narrow-band mobile radio communication format "A" differs from a modulation/demodulation type used by the wide-band mobile radio communication format "B".

The switch 13 can be changed between first and second positions. When the switch 13 assumes the first position, the switch 13 connects the IF band-pass filter 10 to the variable-gain IF amplifier 14 and disconnects the IF band-pass filter 11 from the variable-gain IF amplifier 14. When the switch 13 assumes the second position, the switch 13 connects the IF band-pass filter 11 to the variable-gain IF amplifier 14 and disconnects the IF band-pass filter 10 from the variable-gain IF amplifier 14.

Operation of the receiving section of the background-art mobile radio communication transceiver in FIG. 1 can be changed between first and second modes by the switch 13. The first and second modes of operation correspond to the mobile radio communication formats "A" and "B" respectively. During the first mode of operation of the receiving section, the switch 13 is in its first position at which the variable-gain IF amplifier 14 is connected to the IF band-pass filter 10 and is disconnected from the IF band-pass filter 11. During the second mode of operation of the receiving section, the switch 13 is in its second position at which the variable-gain IF amplifier 14 is connected to the IF band-pass filter 11 and is disconnected from the IF band-pass filter 10.

The first mode of operation of the receiving section of the background-art mobile radio communication transceiver in FIG. 1 will now be explained in more detail. A signal of the narrow-band mobile radio communication format "A" which is received by the antenna 1 travels to the mixer 7 via the duplexer 2 and the RF preamplifier 4. The mixer 7 receives an output signal of the first local oscillator 6. The mixer 7 frequency-converts the received signal of the narrow-band mobile radio communication format "A" into a first IF signal in response to the output signal of the first local oscillator 6. The first IF signal of the narrow-band mobile radio communication format "A" travels from the mixer 7 to the IF band-pass filter 10. The first IF signal of the narrow-band mobile radio communication format "A" is subjected by the IF band-pass filter 10 to a filtering process suited in bandwidth to the narrow-band mobile radio communication format "A". Thus, the IF band-pass filter 10 processes the first IF signal of the narrow-band mobile radio communication format "A" into a second IF signal. The second IF signal of the narrow-band mobile radio communication format "A" travels from the IF band-pass filter 10 to the variable-gain IF amplifier 14 via the switch 13. The variable-gain IF amplifier 14 enlarges the second IF signal of the narrow-band mobile radio communication format "A" into a third IF signal at a controlled gain. The third IF signal of the narrow-band mobile radio communication format "A" travels from the variable-gain IF amplifier 14 to the mixer 17B in the quadrature demodulator 17. The phase shifter 17C in the quadrature demodulator 17 receives an output signal of the second local oscillator 25 which has a predetermined frequency. The device 17C shifts the phase of the output signal of the second local oscillator 25 by 90 degrees. The resultant output signal of the phase shifter 17C is applied to the mixer 17B. The mixer 17B frequency-converts the third IF signal of the narrow-band mobile radio communication format "A" into a first FM signal. The first FM signal of the narrow-band mobile radio communication format "A" travels from the mixer 17B to the band-pass filter 22. The first FM signal of the narrow-band mobile radio communication format "A" is subjected by the band-pass filter 22 to a filtering process suited in bandwidth to the narrow-band mobile radio communication format "A". Thus, the band-pass filter 22 processes the first FM signal of the narrow-band mobile radio communication format "A" into a second FM signal. The second FM signal of the narrow-band mobile radio communication format "A" travels from the band-pass filter 22 to the limiter 23. The device 23 limits the amplitude of the second FM signal of the narrow-band mobile radio communication format "A", and thereby processes the second FM signal into a third FM signal. The third FM signal of the narrow-band mobile radio communication format "A" travels from the limiter 23 to the output terminal 24. Thus, the output terminal 24 is assigned to an FM signal.

The second mode of operation of the receiving section of the background-art mobile radio communication transceiver in FIG. 1 will now be explained in more detail. A signal of the wide-band mobile radio communication format "B" which is received by the antenna 1 travels to the mixer 8 via the duplexer 2 and the RF preamplifier 4. The mixer 8 receives the output signal of the first local oscillator 6. The mixer 8 frequency-converts the received signal of the wide-band mobile radio communication format "B" into a first IF signal in response to the output signal of the first local oscillator 6. The first IF signal of the wide-band mobile radio communication format "B" travels from the mixer 8 to the IF band-pass filter 11. The first IF signal of the wide-band mobile radio communication format "B" is subjected by the IF band-pass filter 11 to a filtering process suited in bandwidth to the wide-band mobile radio communication format "B". Thus, the IF band-pass filter 11 processes the first IF signal of the wide-band mobile radio communication format "B" into a second IF signal. The second IF signal of the wide-band mobile radio communication format "B" travels from the IF band-pass filter 11 to the variable-gain IF amplifier 14 via the switch 13. The variable-gain IF amplifier 14 enlarges the second IF signal of the wide-band mobile radio communication format "B" into a third IF signal at a controlled gain. The third IF signal of the wide-band mobile radio communication format "B" travels from the variable-gain IF amplifier 14 to the mixers 17A and 17B in the quadrature demodulator 17. The mixer 17A receives the output signal of the second local oscillator 25. The mixer 17B receives the output signal of the phase shifter 17C which is quadrature with respect to the output signal of the second local oscillator 25. The mixer 17A demodulates the third IF signal of the wide-band mobile radio communication format "B" into a first I (in-phase) signal in response to the output signal of the second local oscillator 25. The first I signal of the wide-band mobile radio communication format "B" travels from the mixer 17A to the low pass filter 18. The low pass filter 18 removes unwanted high frequency components from the first I signal of the wide-band mobile radio communication format "B", and thereby processes the first I signal into a second I signal. The second I signal of the wide-band mobile radio communication format "B" travels from the low pass filter 18 to the output terminal 20. Thus, the output terminal 20 is assigned to an I signal. The mixer 17B demodulates the third IF signal of the wide-band mobile radio communication format "B" into a first Q (quadrature) signal in response to the output signal of the phase shifter 17C. The first Q signal of the wide-band mobile radio communication format "B" travels from the mixer 17B to the low pass filter 19. The low pass filter 19 removes unwanted high-frequency components from the first Q signal of the wide-band mobile radio communication format "B", and thereby processes the first Q signal into a second Q signal. The second Q signal of the wide-band mobile radio communication format "B" travels from the low pass filter 19 to the output terminal 21. Thus, the output terminal 21 is assigned to a Q signal.

The transmitting section 3 generates a signal to be transmitted. The transmitted signal is fed from the transmitting section 3 to the antenna 1 via the duplexer 2. The transmitted signal is radiated by the antenna 1.

As understood from the previous explanation, the receiving section of the background-art mobile radio communication transceiver in FIG. 1 can handle both a received signal of the narrow-band mobile radio communication format "A" and a received signal of the wide-band mobile radio communication format "B".

In the background-art mobile radio communication transceiver of FIG. 1, both an IF signal of the narrow-band mobile radio communication format "A" and an IF signal of the wide-band mobile radio communication format "B" are processed by the variable-gain IF amplifier 14.

Generally, a variable-gain IF amplifier is lower than a fixed-gain IF amplifier in intercept point. Thus, the variable-gain IF amplifier is poorer than the fixed-gain IF amplifier in suppressing or preventing intermodulation distortion.

In the background-art mobile radio communication transceiver of FIG. 1, the IF band-pass filter 11 can adequately remove intermodulation-causing components from an input IF signal of the wide-band mobile radio communication format "B". Accordingly, it is possible to sufficiently suppress or prevent intermodulation distortion of an IF signal of the wide-band mobile radio communication format "B" which is outputted from the variable-gain IF amplifier 14.

In the background-art mobile radio communication transceiver of FIG. 1, the IF band-pass filter 10 tends to inadequately remove intermodulation-causing components from an input IF signal of the narrow-band mobile radio communication format "A". Accordingly, intermodulation distortion with a considerable level often occurs in an IF signal of the narrow-band mobile radio communication format "A" which is outputted from the variable-gain IF amplifier 14.

Figure 2:
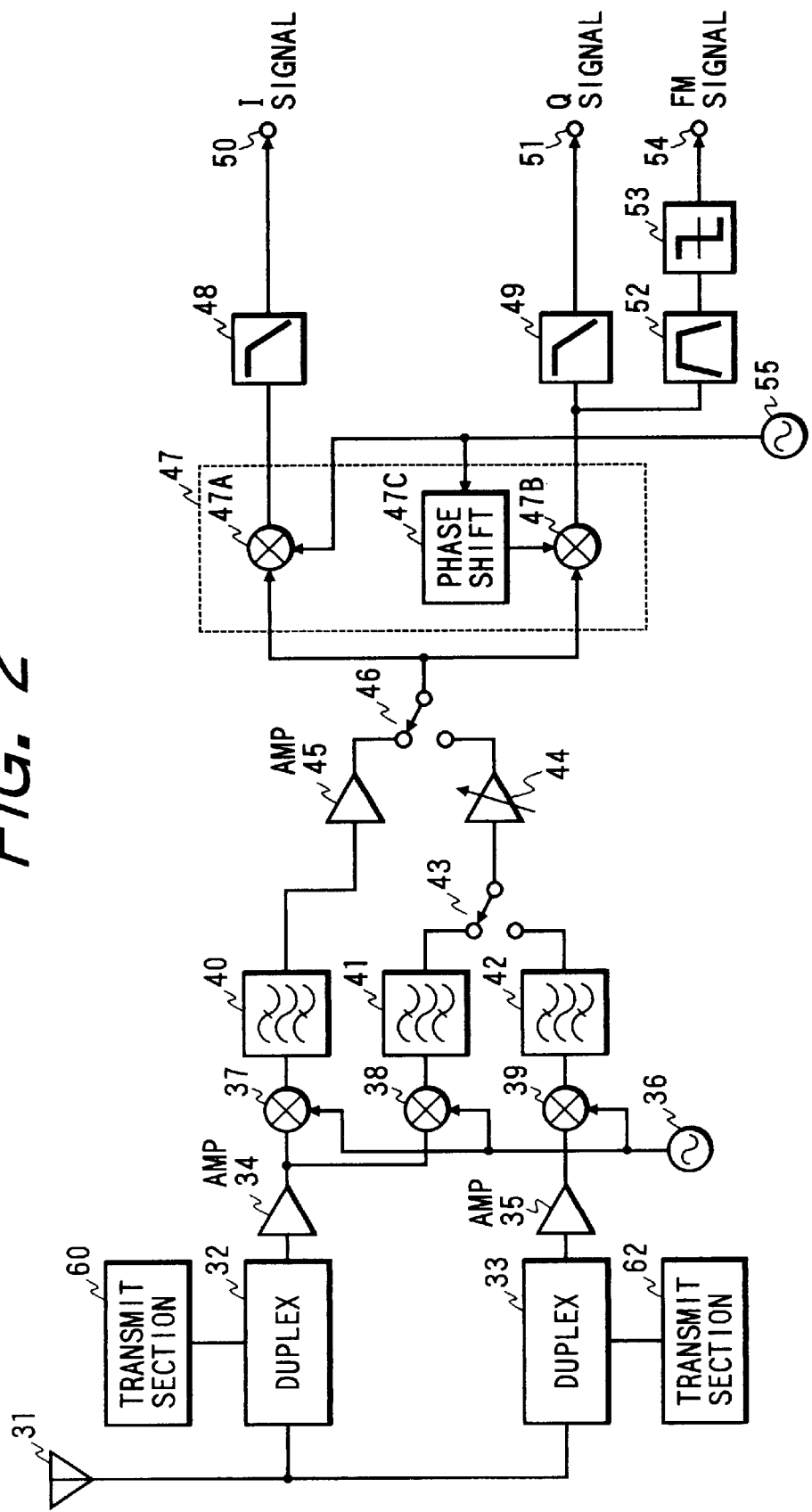
FIG. 2 is a block diagram of a mobile radio communication transceiver according to an embodiment of this invention.

FIG. 2 shows a mobile radio communication transceiver according to an embodiment of this invention. The mobile radio communication transceiver in FIG. 2 is provided with an antenna 31 connected to duplexers 32 and 33. The duplexer 32 is connected to a receiving section and a transmitting section 60. The duplexer 33 is connected to the receiving section and a transmitting section 62.

The receiving section includes RF (radio frequency) preamplifiers 34 and 35, a first local oscillator 36, mixers 37, 38, and 39, IF (intermediate frequency) band-pass filters 40, 41, and 42, a switch 43, a variable-gain IF amplifier 44, a fixed-gain IF amplifier 45, and a switch 46. The receiving section further includes a quadrature demodulator 47, low pass filters 48 and 49, output terminals 50 and 51, a band-pass filter 52, a limiter 53, an output terminal 54, and a second local oscillator 55.

The input terminal of the RF preamplifier 34 is connected to the duplexer 32. The output terminal of the RF preamplifier 34 is connected to first input terminals of the mixers 37 and 38. The output terminal of the first local oscillator 36 is connected to second input terminals of the mixers 37 and 38. The output terminal of the mixer 37 is connected to the input terminal of the IF band-pass filter 40. The output terminal of the IF band-pass filter 40 is connected to the input terminal of the fixed-gain IF amplifier 45. The output terminal of the fixed-gain IF amplifier 45 is connected to a first input side of the switch 46. The output terminal of the mixer 38 is connected to the input terminal of the IF and-pass filter 41. The output terminal of the IF band-pass filter 41 is connected to a first input side of the switch 43. The input terminal of the RF preamplifier 35 is connected to the duplexer 33. The output terminal of the RF preamplifier 35 is connected to a first input terminal of the mixer 39. The output terminal of the first local oscillator 36 is connected to a second input terminal of the mixer 39. The output terminal of the mixer 39 is connected to the input terminal of the IF band-pass filter 42. The output terminal of the IF band-pass filter 42 is connected to a second input side of the switch 43. An output side of the switch 43 is connected to the input terminal of the variable-gain IF amplifier 44. The output terminal of the variable-gain IF amplifier 44 is connected to a second input side of the switch 46.

The quadrature demodulator 47 follows an output side of the switch 46. The quadrature demodulator 47 includes mixers 47A and 47B, and a phase shifter 47C. First input terminals of the mixers 47A and 47B are connected to the output side of the switch 46. A second input terminal of the mixer 47A is connected to the output terminal of the second local oscillator 55. A second input terminal of the mixer 47B is connected to the output terminal of the phase shifter 47C. The input terminal of the phase shifter 47C is connected to the output terminal of the second local oscillator 55. The output terminal of the mixer 47A is connected to the input terminal of the low pass filter 48. The low pass filter 48 is followed by the output terminal 50 of the receiving section. The output terminal of the mixer 47B is connected to the input terminal of the low pass filter 49. The low pass filter 49 is followed by the output terminal 51 of the receiving section. The output terminal of the mixer 47B is also connected to the input terminal of the band-pass filter 52. The output terminal of the band-pass filter 52 is connected to the input terminal of the limiter 53. The limiter 53 is followed by the output terminal 54 of the receiving section.

The IF band-pass filter 40 has a pass bandwidth predetermined in conformity with a narrow-band mobile radio communication format "A" which prescribes a used RF band "X". An example of the narrow-band mobile radio communication format "A" is an FM (frequency modulation) mobile radio communication format. The IF band-pass filter 41 has a pass bandwidth predetermined in conformity with a wide-band mobile radio communication format "B" based on, for example, a spread spectrum technique. Also, the wide-band mobile radio communication format "B" prescribes the used RF band "X". The IF band-pass filter 42 has a pass bandwidth predetermined in conformity with a wide-band mobile radio communication format "C" which prescribes a used RF band "Y" different from the RF band "X". Accordingly, the pass bandwidth of the IF band-pass filter 40 is narrower than the pass bandwidths of the IF band-pass filters 41 and 42. Furthermore, a modulation/demodulation type used by the narrow-band mobile radio communication format "A" differs from modulation/demodulation types used by the wide-band mobile radio communication formats "B" and "C".

The switch 43 can be changed between first and second positions. When the switch 43 assumes the first position, the switch 43 connects the IF band-pass filter 41 to the variable-gain IF amplifier 44 and disconnects the IF band-pass filter 42 from the variable-gain IF amplifier 44. When the switch 43 assumes the second position, the switch 43 connects the IF band-pass filter 42 to the variable-gain IF amplifier 44 and disconnects the IF band-pass filter 41 from the variable-gain IF amplifier 44.

The switch 46 can be changed between first and second positions. When the switch 46 assumes the first position, the switch 46 connects the fixed-gain IF amplifier 45 to the quadrature demodulator 47 and disconnects the variable-gain IF amplifier 44 from the quadrature demodulator 47. When the switch 46 assumes the second position, the switch 46 connects the variable-gain IF amplifier 44 to the quadrature demodulator 47 and disconnects the fixed-gain IF amplifier 45 from the quadrature demodulator 47.

Operation of the receiving section of the mobile radio communication transceiver in FIG. 2 can be changed among first, second, and third modes by the switches 43 and 46. The first, second, and third modes of operation correspond to the mobile radio communication formats "A", "B", and "C" respectively. During the first mode of operation of the receiving section, the switch 46 is in its first position at which the quadrature demodulator 47 is connected to the fixed-gain IF amplifier 45 and is disconnected from the variable-gain IF amplifier 44. During the second mode of operation of the receiving section, the switch 43 is in its first position at which the variable-gain IF amplifier 44 is connected to the IF band-pass filter 41 and is disconnected from the IF band-pass filter 42. During the second mode of operation of the receiving section, the switch 46 is in its second position at which the quadrature demodulator 47 is connected to the variable-gain IF amplifier 44 and is disconnected from the fixed-gain IF amplifier 45. During the third mode of operation of the receiving section, the switch 43 is in its second position at which the variable-gain IF amplifier 44 is connected to the IF band-pass filter 42 and is disconnected from the IF band-pass filter 41. During the third mode of operation of the receiving section, the switch 46 is in its second position at which the quadrature demodulator 47 is connected to the variable-gain IF amplifier 44 and is disconnected from the fixed-gain IF amplifier 45.

The first mode of operation of the receiving section of the mobile radio communication transceiver in FIG. 2 will now be explained in more detail. A signal of the narrow-band mobile radio communication format "A" which is received by the antenna 31 travels to the mixer 37 via the duplexer 32 and the RF preamplifier 34. The mixer 37 receives an output signal of the first local oscillator 36. The mixer 37 frequency-converts the received signal of the narrow-band mobile radio communication format "A" into a first IF signal in response to the output signal of the first local oscillator 36. The first IF signal of the narrow-band mobile radio communication format "A" travels from the mixer 37 to the IF band-pass filter 40. The first IF signal of the narrow-band mobile radio communication format "A" is subjected by the IF band-pass filter 40 to a filtering process suited in bandwidth to the narrow-band mobile radio communication format "A". Thus, the IF band-pass filter 40 processes the first IF signal of the narrow-band mobile radio communication format "A" into a second IF signal. The second IF signal of the narrow-band mobile radio communication format "A" travels from the IF band-pass filter 40 to the fixed-gain IF amplifier 45. The fixed-gain IF amplifier 45 enlarges the second IF signal of the narrow-band mobile radio communication format "A" into a third IF signal at a fixed gain. The third IF signal of the narrow-band mobile radio communication format "A" travels from the fixed-gain IF amplifier 45 to the mixer 47B in the quadrature demodulator 47 via the switch 46. The phase shifter 47C in the quadrature demodulator 47 receives an output signal of the second local oscillator 55 which has a predetermined frequency. The device 47C shifts the phase of the output signal of the local oscillator 55 by 90 degrees. The resultant output signal of the phase shifter 47C is applied to the mixer 47B. The mixer 47B frequency-converts the third IF signal of the narrow-band mobile radio communication format "A" into a first FM signal. The first FM signal of the narrow-band mobile radio communication format "A" travels from the mixer 47B to the band-pass filter 52. The first FM signal of the narrow-band mobile radio communication format "A" is subjected by the band-pass filter 52 to a filtering process suited in bandwidth to the narrow-band mobile radio communication format "A". Thus, the band-pass filter 52 processes the first FM signal of the narrow-band mobile radio communication format "A" into a second FM signal. The second FM signal of the narrow-band mobile radio communication format "A" travels from the band-pass filter 52 to the limiter 53. The device 53 limits the amplitude of the second FM signal of the narrow-band mobile radio communication format "A", and thereby processes the second FM signal into a third FM signal. The third FM signal of the narrow-band mobile radio communication format "A" travels from the limiter 53 to the output terminal 54. Thus, the output terminal 54 is assigned to an FM signal.

The second mode of operation of the receiving section of the mobile radio communication transceiver in FIG. 2 will now be explained in more detail. A signal of the wide-band mobile radio communication format "B" which is received by the antenna 31 travels to the mixer 38 via the duplexer 32 and the RF preamplifier 34. The mixer 38 receives the output signal of the first local oscillator 36. The mixer 38 frequency-converts the received signal of the wide-band mobile radio communication format "B" into a first IF signal in response to the output signal of the first local oscillator 36. The first IF signal of the wide-band mobile radio communication format "B" travels from the mixer 38 to the IF band-pass filter 41. The first IF signal of the wide-band mobile radio communication format "B" is subjected by the IF band-pass filter 41 to a filtering process suited in bandwidth to the wide-band mobile radio communication format "B". Thus, the IF band-pass filter 41 processes the first IF signal of the wide-band mobile radio communication format "B" into a second IF signal. The second IF signal of the wide-band mobile radio communication format "B" travels from the IF band-pass filter 41 to the variable-gain IF amplifier 44 via the switch 43. The variable-gain IF amplifier 44 enlarges the second IF signal of the wide-band mobile radio communication format "B" into a third IF signal at a controlled gain. The third IF signal of the wide-band mobile radio communication format "B" travels from the variable-gain IF amplifier 44 to the mixers 47A and 47B in the quadrature demodulator 47 via the switch 46. The mixer 47A receives the output signal of the second local oscillator 55. The mixer 47B receives the output signal of the phase shifter 47C which is quadrature with respect to the output signal of the second local oscillator 55. The mixer 47A demodulates the third IF signal of the wide-band mobile radio communication format "B" into a first I (in-phase) signal in response to the output signal of the second local oscillator 55. The first I signal of the wide-band mobile radio communication format "B" travels from the mixer 47A to the low pass filter 48. The low pass filter 48 removes unwanted high-frequency components from the first I signal of the wide-band mobile radio communication format "B", and thereby processes the first I signal into a second I signal. The second I signal of the wide-band mobile radio communication format "B" travels from the low pass filter 48 to the output terminal 50. Thus, the output terminal 50 is assigned to an I signal. The mixer 47B demodulates the third IF signal of the wide-band mobile radio communication format "B" into a first Q (quadrature) signal in response to the output signal of the phase shifter 47C. The first Q signal of the wide-band mobile radio communication format "B" travels from the mixer 47B to the low pass filter 49. The low pass filter 49 removes unwanted high-frequency components from the first Q signal of the wide-band mobile radio communication format "B", and thereby processes the first Q signal into a second Q signal. The second Q signal of the wide-band mobile radio communication format "B" travels from the low pass filter 49 to the output terminal 51. Thus, the output terminal 51 is assigned to a Q signal.

The third mode of operation of the receiving section of the mobile radio communication transceiver in FIG. 2 will now be explained in more detail. A signal of the wide-band mobile radio communication format "C" which is received by the antenna 31 travels to the mixer 39 via the duplexer 33 and the RF preamplifier 35. The mixer 39 receives the output signal of the first local oscillator 36. The mixer 39 frequency-converts the received signal of the wide-band mobile radio communication format "C" into a first IF signal in response to the output signal of the first local oscillator 36. The first IF signal of the wide-band mobile radio communication format "C" travels from the mixer 39 to the IF band-pass filter 42. The first IF signal of the wide-band mobile radio communication format "C" is subjected by the IF band-pass filter 42 to a filtering process suited in bandwidth to the wide-band mobile radio communication format "C". Thus, the IF band-pass filter 42 processes the first IF signal of the wide-band mobile radio communication format "C" into a second IF signal. The second IF signal of the wide-band mobile radio communication format "C" travels from the IF band-pass filter 42 to the variable-gain IF amplifier 44 via the switch 43. The variable-gain IF amplifier 44 enlarges the second IF signal of the wide-band mobile radio communication format "C" into a third IF signal at a controlled gain. The third IF signal of the wide-band mobile radio communication format "C" travels from the variable-gain IF amplifier 44 to the mixers 47A and 47B in the quadrature demodulator 47 via the switch 46. The mixer 47A receives the output signal of the second local oscillator 55. The mixer 47B receives the output signal of the phase shifter 47C which is quadrature with respect to the output signal of the second local oscillator 55. The mixer 47A demodulates the third IF signal of the wide-band mobile radio communication format "C" into a first I (in-phase) signal in response to the output signal of the second local oscillator 55. The first I signal of the wide-band mobile radio communication format "C" travels from the mixer 47A to the low pass filter 48. The low pass filter 48 removes unwanted high-frequency components from the first I signal of the wide-band mobile radio communication format "C", and thereby processes the first I signal into a second I signal. The second I signal of the wide-band mobile radio communication format "C" travels from the low pass filter 48 to the output terminal 50. The mixer 47B demodulates the third IF signal of the wide-band mobile radio communication format "C" into a first Q (quadrature) signal in response to the output signal of the phase shifter 47C. The first Q signal of the wide-band mobile radio communication format "C" travels from the mixer 47B to the low pass filter 49. The low pass filter 49 removes unwanted high-frequency components from the first Q signal of the wide-band mobile radio communication format "C", and thereby processes the first Q signal into a second Q signal. The second Q signal of the wide-band mobile radio communication format "C" travels from the low pass filter 49 to the output terminal 51.

The transmitting section 60 generates a signal to be transmitted. The transmitted signal is fed from the transmitting section 60 to the antenna 31 via the duplexer 32. The transmitted signal is radiated by the antenna 31.

The transmitting section 62 generates a signal to be transmitted. The transmitted signal is fed from the transmitting section 62 to the antenna 31 via the duplexer 33. The transmitted signal is radiated by the antenna 31.

As understood from the previous explanation, the receiving section of the mobile radio communication transceiver in FIG. 2 can handle a received signal of the narrow-band mobile radio communication format "A", a received signal of the wide-band mobile radio communication format "B", and a received signal of the wide-band mobile radio communication format "C".

In the mobile radio communication transceiver of FIG. 2, the IF band-pass filter 41 can adequately remove intermodulation causing components from an input IF signal of the wide-band mobile radio communication format "B". Accordingly, it is possible to sufficiently suppress or prevent intermodulation distortion of an IF signal of the wide-band mobile radio communication format "B" which is outputted from the variable-gain IF amplifier 44.

In the mobile radio communication transceiver of FIG. 2, the IF band-pass filter 42 can adequately remove intermodulation causing components from an input IF signal of the wide-band mobile radio communication format "C". Accordingly, it is possible to sufficiently suppress or prevent intermodulation distortion of an IF signal of the wide-band mobile radio communication format "C" which is outputted from the variable-gain IF amplifier 44.

The fixed-gain IF amplifier 45 is higher than the variable-gain IF amplifier 44 in intercept point. Thus, the fixed-gain IF amplifier 45 is better than the variable-gain IF amplifier 44 in suppressing or preventing intermodulation distortion. Accordingly, even if the IF band-pass filter 40 inadequately removes intermodulation-causing components from an input IF signal of the narrow-band mobile radio communication format "A", it is possible to sufficiently suppress or prevent intermodulation distortion of an IF signal of the narrow-band mobile radio communication format "A" which is outputted from the fixed-gain IF amplifier 45.

According to a modification of the mobile radio communication transceiver of FIG. 2, the mixer 37 and the IF band-pass filter 40 are omitted, and the mixer 38 and the IF band-pass filter 41 are used also for a received signal of the narrow-band mobile radio communication format "A". In addition, the input terminal of the fixed-gain IF amplifier 45 is connected to the output terminal of the IF band-pass filter 41.

The mobile radio communication transceiver of FIG. 2 may be modified to be capable of handling four or more different mobile radio communication formats including at least one narrow-band mobile radio communication format and at least one wide-band mobile radio communication format. In this modification, a fixed-gain IF amplifier (the fixed-gain IF amplifier 45) is used for an IF signal of the narrow-band mobile radio communication format while a variable-gain IF amplifier (the variable-gain IF amplifier 44) is used for an IF signal of the wide-band mobile radio communication format.

Figure 3:
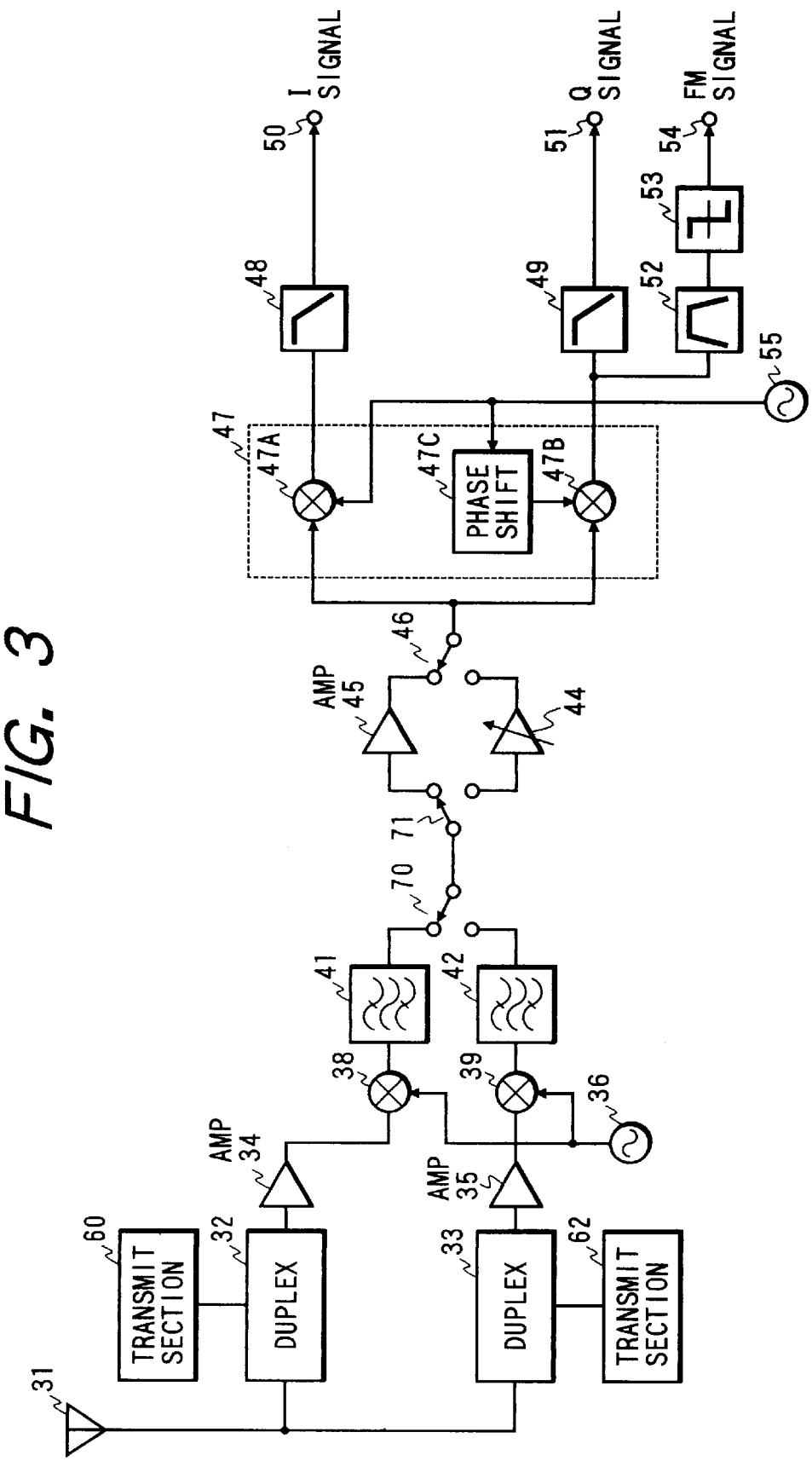
FIG. 3 is a block diagram of a mobile radio communication transceiver according to another embodiment of this invention.

FIG. 3 shows a mobile radio communication transceiver according to another embodiment of this invention. The mobile radio communication transceiver in FIG. 3 is provided with an antenna 31 connected to duplexers 32 and 33. The duplexer 32 is connected to a receiving section and a transmitting section 60. The duplexer 33 is connected to the receiving section and a transmitting section 62.

The receiving section includes RF (radio frequency) preamplifiers 34 and 35, a first local oscillator 36, mixers 38 and 39, IF (intermediate frequency) band-pass filters 41 and 42, a variable-gain IF amplifier 44, a fixed-gain IF amplifier 45, switches 46, 70, and 71. The receiving section further includes a quadrature demodulator 47, low pass filters 48 and 49, output terminals 50 and 51, a band-pass filter 52, a limiter 53, an output terminal 54, and a second local oscillator 55.

The input terminal of the RF preamplifier 34 is connected to the duplexer 32. The output terminal of the RF preamplifier 34 is connected to a first input terminal of the mixer 38. The output terminal of the first local oscillator 36 is connected to a second input terminal of the mixer 38. The output terminal of the mixer 38 is connected to the input terminal of the IF band-pass filter 41. The output terminal of the IF band-pass filter 41 is connected to a first input side of the switch 70. The input terminal of the RF preamplifier 35 is connected to the duplexer 33. The output terminal of the RF preamplifier 35 is connected to a first input terminal of the mixer 39. The output terminal of the first local oscillator 36 is connected to a second input terminal of the mixer 39. The output terminal of the mixer 39 is connected to the input terminal of the IF band-pass filter 42. The output terminal of the IF band-pass filter 42 is connected to a second input side of the switch 70. An output side of the switch 70 is connected to an input side of the switch 71. A first output side of the switch 71 is connected to the input terminal of the fixed-gain IF amplifier 45. The output terminal of the fixed-gain IF amplifier 45 is connected to a first input side of the switch 46. A second output side of the switch 71 is connected to the input terminal of the variable-gain IF amplifier 44. The output terminal of the variable-gain IF amplifier 44 is connected to a second input side of the switch 46.

The quadrature demodulator 47 follows an output side of the switch 46. The quadrature demodulator 47 includes mixers 47A and 47B, and a phase shifter 47C. First input terminals of the mixers 47A and 47B are connected to the output side of the switch 46. A second input terminal of the mixer 47A is connected to the output terminal of the second local oscillator 55. A second input terminal of the mixer 47B is connected to the output terminal of the phase shifter 47C. The input terminal of the phase shifter 47C is connected to the output terminal of the second local oscillator 55. The output terminal of the mixer 47A is connected to the input terminal of the low pass filter 48. The low pass filter 48 is followed by the output terminal 50 of the receiving section. The output terminal of the mixer 47B is connected to the input terminal of the low pass filter 49. The low pass filter 49 is followed by the output terminal 51 of the receiving section. The output terminal of the mixer 47B is also connected to the input terminal of the band-pass filter 52. The output terminal of the band-pass filter 52 is connected to the input terminal of the limiter 53. The limiter 53 is followed by the output terminal 54 of the receiving section.

The IF band-pass filter 41 has a pass bandwidth predetermined in conformity with a wide-band mobile radio communication format "B" based on, for example, a spread spectrum technique. Also, the wide-band mobile radio communication format "B" prescribes a used RF band "X". The IF band-pass filter 42 has a pass bandwidth predetermined in conformity with a wide-band mobile radio communication format "C" which prescribes a used RF band "Y" different from the RF band "X".

As will be made clear later, the receiving section of the mobile radio communication transceiver in FIG. 3 is able to handle a radio signal of a narrow-band mobile radio communication format "A" which prescribes the used RF band "X". An example of the narrow-band mobile radio communication format "A" is an FM (frequency modulation) mobile radio communication format. A modulation/demodulation type used by the narrow-band mobile radio communication format "A" differs from modulation/demodulation types used by the wide-band mobile radio communication formats "B" and "C". An IF signal of the narrow-band mobile radio communication format "A" is allowed to travel through the IF band-pass filter 41 without being damaged thereby.

The switch 70 can be changed between first and second positions. When the switch 70 assumes the first position, the switch 70 connects the IF band-pass filter 41 to the switch 71 and disconnects the IF band-pass filter 42 from the switch 71. When the switch 70 assumes the second position, the switch 70 connects the IF band-pass filter 42 to the switch 71 and disconnects the IF band-pass filter 41 from the switch 71.

The switch 71 can be changed between first and second positions. The switch 46 can be changed between first and second positions. Generally, the switches 46 and 71 are linked or ganged to select one of the variable-gain IF amplifier 44 and the fixed-gain IF amplifier 45. When the switches 46 and 71 assume their first positions, the variable-gain IF amplifier 44 is selected and is connected between the switch 70 and the quadrature demodulator 47. When the switches 46 and 71 assume their second positions, the fixed-gain IF amplifier 45 is selected and is connected between the switch 70 and the quadrature demodulator 47.

Operation of the receiving section of the mobile radio communication transceiver in FIG. 3 can be changed among first, second, and third modes by the switches 46, 70, and 71. The first, second, and third modes of operation correspond to the mobile radio communication formats "A", "B", and "C" respectively. During the first mode of operation of the receiving section, the IF band-pass filter 41, the fixed-gain IF amplifier 45, and the quadrature demodulator 47 are successively connected by the switches 46, 70, and 71. During the second mode of operation of the receiving section, the IF band-pass filter 41, the variable-gain IF amplifier 44, and the quadrature demodulator 47 are successively connected by the switches 46, 70, and 71. During the third mode of operation of the receiving section, the IF band-pass filter 42, the variable-gain IF amplifier 44, and the quadrature demodulator 47 are successively connected by the switches 46, 70, and 71.

During the first mode of operation of the receiving section, the IF band-pass filter 41, the variable-gain IF amplifier 44, and the quadrature demodulator 47 may be successively connected by the switches 46, 70, and 71.

The first mode of operation of the receiving section of the mobile radio communication transceiver in FIG. 3 will now be explained in more detail. A signal of the narrow-band mobile radio communication format "A" which is received by the antenna 31 travels to the mixer 38 via the duplexer 32 and the RF preamplifier 34. The mixer 38 receives an output signal of the first local oscillator 36. The mixer 38 frequency-converts the received signal of the narrow-band mobile radio communication format "A" into a first IF signal in response to the output signal of the first local oscillator 36. The first IF signal of the narrow-band mobile radio communication format "A" travels from the mixer 38 to the IF band-pass filter 41. The first IF signal of the narrow-band mobile radio communication format "A" is subjected by the IF band-pass filter 41 to a filtering process. Thus, the IF band-pass filter 41 processes the first IF signal of the narrow-band mobile radio communication format "A" into a second IF signal. The second IF signal of the narrow-band mobile radio communication format "A" travels from the IF band-pass filter 41 to the fixed-gain IF amplifier 45 via the switches 70 and 71. The fixed-gain IF amplifier 45 enlarges the second IF signal of the narrow-band mobile radio communication format "A" into a third IF signal at a fixed gain. The third IF signal of the narrow-band mobile radio communication format "A" travels from the fixed-gain IF amplifier 45 to the mixer 47B in the quadrature demodulator 47 via the switch 46. The phase shifter 47C in the quadrature demodulator 47 receives an output signal of the second local oscillator 55 which has a predetermined frequency. The device 47C shifts the phase of the output signal of the local oscillator 55 by 90 degrees. The resultant output signal of the phase shifter 47C is applied to the mixer 47B. The mixer 47B frequency converts the third IF signal of the narrow-band mobile radio communication format "A" into a first FM signal. The first FM signal of the narrow-band mobile radio communication format "A" travels from the mixer 47B to the band-pass filter 52. The first FM signal of the narrow-band mobile radio communication format "A" is subjected by the band-pass filter 52 to a filtering process suited in bandwidth to the narrow-band mobile radio communication format "A". Thus, the band-pass filter 52 processes the first FM signal of the narrow-band mobile radio communication format "A" into a second FM signal. The second FM signal of the narrow-band mobile radio communication format "A" travels from the band-pass filter 52 to the limiter 53. The device 53 limits the amplitude of the second FM signal of the narrow-band mobile radio communication format "A", and thereby processes the second FM signal into a third FM signal. The third FM signal of the narrow-band mobile radio communication format "A" travels from the limiter 53 to the output terminal 54. Thus, the output terminal 54 is assigned to an FM signal.

The second mode of operation of the receiving section of the mobile radio communication transceiver in FIG. 3 will now be explained in more detail. A signal of the wide-band mobile radio communication format "B" which is received by the antenna 31 travels to the mixer 38 via the duplexer 32 and the RF preamplifier 34. The mixer 38 receives the output signal of the first local oscillator 36. The mixer 38 frequency-converts the received signal of the wide-band mobile radio communication format "B" into a first IF signal in response to the output signal of the first local oscillator 36. The first IF signal of the wide-band mobile radio communication format "B" travels from the mixer 38 to the IF band-pass filter 41. The first IF signal of the wide-band mobile radio communication format "B" is subjected by the IF band-pass filter 41 to a filtering process suited in bandwidth to the wide-band mobile radio communication format "B". Thus, the IF band-pass filter 41 processes the first IF signal of the wide-band mobile radio communication format "B" into a second IF signal. The second IF signal of the wide-band mobile radio communication format "B" travels from the IF band-pass filter 41 to the variable-gain IF amplifier 44 via the switches 70 and 71. The variable-gain IF amplifier 44 enlarges the second IF signal of the wide-band mobile radio communication format "B" into a third IF signal at a controlled gain. The third IF signal of the wide-band mobile radio communication format "B" travels from the variable-gain IF amplifier 44 to the mixers 47A and 47B in the quadrature demodulator 47 via the switch 46. The mixer 47A receives the output signal of the second local oscillator 55. The mixer 47B receives the output signal of the phase shifter 47C which is quadrature with respect to the output signal of the second local oscillator 55. The mixer 47A demodulates the third IF signal of the wide-band mobile radio communication format "B" into a first I (in-phase) signal in response to the output signal of the second local oscillator 55. The first I signal of the wide-band mobile radio communication format "B" travels from the mixer 47A to the low pass filter 48. The low pass filter 48 removes unwanted high-frequency components from the first I signal of the wide-band mobile radio communication format "B", and thereby processes the first I signal into a second I signal. The second I signal of the wide-band mobile radio communication format "B" travels from the low pass filter 48 to the output terminal 50. Thus, the output terminal 50 is assigned to an I signal. The mixer 47B demodulates the third IF signal of the wide-band mobile radio communication format "B" into a first Q (quadrature) signal in response to the output signal of the phase shifter 47C. The first Q signal of the wide-band mobile radio communication format "B" travels from the mixer 47B to the low pass filter 49. The low pass filter 49 removes unwanted high-frequency components from the first Q signal of the wide-band mobile radio communication format "B", and thereby processes the first Q signal into a second Q signal. The second Q signal of the wide-band mobile radio communication format "B" travels from the low pass filter 49 to the output terminal 51. Thus, the output terminal 51 is assigned to a Q signal.

The third mode of operation of the receiving section of the mobile radio communication transceiver in FIG. 3 will now be explained in more detail. A signal of the wide-band mobile radio communication format "C" which is received by the antenna 31 travels to the mixer 39 via the duplexer 33 and the RF preamplifier 35. The mixer 39 receives the output signal of the first local oscillator 36. The mixer 39 frequency-converts the received signal of the wide-band mobile radio communication format "C" into a first IF signal in response to the output signal of the first local oscillator 36. The first IF signal of the wide-band mobile radio communication format "C" travels from the mixer 39 to the IF band-pass filter 42. The first IF signal of the wide-band mobile radio communication format "C" is subjected by the IF band-pass filter 42 to a filtering process suited in bandwidth to the wide-band mobile radio communication format "C". Thus, the IF band-pass filter 42 processes the first IF signal of the wide-band mobile radio communication format "C" into a second IF signal. The second IF signal of the wide-band mobile radio communication format "C" travels from the IF band-pass filter 42 to the variable-gain IF amplifier 44 via the switches 70 and 71. The variable-gain IF amplifier 44 enlarges the second IF signal of the wide-band mobile radio communication format "C" into a third IF signal at a controlled gain. The third IF signal of the wide-band mobile radio communication format "C" travels from the variable-gain IF amplifier 44 to the mixers 47A and 47B in the quadrature demodulator 47 via the switch 46. The mixer 47A receives the output signal of the second local oscillator 55. The mixer 47B receives the output signal of the phase shifter 47C which is quadrature with respect to the output signal of the second local oscillator 55. The mixer 47A demodulates the third IF signal of the wide-band mobile radio communication format "C" into a first I (in-phase) signal in response to the output signal of the second local oscillator 55. The first I signal of the wide-band mobile radio communication format "C" travels from the mixer 47A to the low pass filter 48. The low pass filter 48 removes unwanted high-frequency components from the first I signal of the wide-band mobile radio communication format "C", and thereby processes the first I signal into a second I signal. The second I signal of the wide-band mobile radio communication format "C" travels from the low pass filter 48 to the output terminal 50. The mixer 47B demodulates the third IF signal of the wide-band mobile radio communication format "C" into a first Q (quadrature) signal in response to the output signal of the phase shifter 47C. The first Q signal of the wide-band mobile radio communication format "C" travels from the mixer 47B to the low pass filter 49. The low pass filter 49 removes unwanted high-frequency components from the first Q signal of the wide-band mobile radio communication format "C", and thereby processes the first Q signal into a second Q signal. The second Q signal of the wide-band mobile radio communication format "C" travels from the low pass filter 49 to the output terminal 51.

The transmitting section 60 generates a signal to be transmitted. The transmitted signal is fed from the transmitting section 60 to the antenna 31 via the duplexer 32. The transmitted signal is radiated by the antenna 31.

The transmitting section 62 generates a signal to be transmitted. The transmitted signal is fed from the transmitting section 62 to the antenna 31 via the duplexer 33. The transmitted signal is radiated by the antenna 31.

As understood from the previous explanation, the receiving section of the mobile radio communication transceiver in FIG. 3 can handle a received signal of the narrow-band mobile radio communication format "A", a received signal of the wide-band mobile radio communication format "B", and a received signal of the wide-band mobile radio communication format "C".

In the mobile radio communication transceiver of FIG. 3, the IF band-pass filter 41 can adequately remove intermodulation-causing components from an input IF signal of the wide-band mobile radio communication format "B". Accordingly, it is possible to sufficiently suppress or prevent intermodulation distortion of an IF signal of the wide-band mobile radio communication format "B" which is outputted from the variable-gain IF amplifier 44.

In the mobile radio communication transceiver of FIG. 3, the IF band-pass filter 42 can adequately remove intermodulation-causing components from an input IF signal of the wide-band mobile radio communication format "C". Accordingly, it is possible to sufficiently suppress or prevent intermodulation distortion of an IF signal of the wide-band mobile radio communication format "C" which is outputted from the variable-gain IF amplifier 44.

The fixed-gain IF amplifier 45 is higher than the variable-gain IF amplifier 44 in intercept point. Thus, the fixed-gain IF amplifier 45 is better than the variable-gain IF amplifier 44 in suppressing or preventing intermodulation distortion. Accordingly, even if the IF band-pass filter 41 inadequately removes intermodulation-causing components from an input IF signal of the narrow-band mobile radio communication format "A", it is possible to sufficiently suppress or prevent intermodulation distortion of an IF signal of the narrowband mobile radio communication format "A" which is outputted from the fixed-gain IF amplifier 45.

The mobile radio communication transceiver of FIG. 3 may be modified to be capable of handling four or more different mobile radio communication formats including at least one narrow-band mobile radio communication format and at least one wide-band mobile radio communication format. In this modification, a fixed-gain IF amplifier (the fixed-gain IF amplifier 45) is used for an IF signal of the narrow-band mobile radio communication format while a variable-gain IF amplifier (the variable-gain IF amplifier 44) is used for an IF signal of the wide-band mobile radio communication format.

What is claimed is:

1. A radio communication apparatus for a plurality of different radio communication formats, one of which can be selected, the apparatus comprising:

a fixed-gain IF amplifier;

a variable-gain IF amplifier; and a first IF band-pass filter having a first predetermined pass bandwidth;

a second IF band-pass filter having a second predetermined pass bandwidth;

means for selectably pairing one out of the fixed-gain IF amplifier and the variable-gain IF amplifier with one of said first and second IF bandpass filters in response to which of the radio communication formats is selected to provide optimal intermodulation characteristics of an IF amplification stage.

2. A radio communication apparatus for a narrow-band radio communication format and a first wide-band radio communication format, one of which can be selected, the apparatus comprising:

a fixed-gain IF amplifier;

a variable-gain IF amplifier;

a first IF bandpass filter having a first predetermined pass bandwidth;

means for selectably pairing the fixed-gain IF amplifier with said first IF bandpass filter when the narrow-band radio communication format is selected; and means for selectably pairing the variable-gain IF amplifier with said first IF bandpass filter when the first wide-band radio communication format is selected to provide optimal intermodulation characteristics of an IF amplification stage.

3. A radio communication apparatus for selectable first and second radio communication formats which prescribe first and second desired IF pass bandwidths respectively, the first desired IF pass bandwidth being greater than the second desired IF pass bandwidth, the apparatus comprising:

a first IF bandpass filter, having a first predetermined pass bandwidth corresponding to the first desired IF pass bandwidth, for filtering a first IF signal of the first radio communication format;

a second IF bandpass filter, having a second predetermined pass bandwidth corresponding to the second desired IF pass bandwidth, for filtering a second IF signal of the second radio communication format;

a variable-gain IF amplifier which may be selectable paired with the first IF bandpass filter for amplifying an output signal of the first IF bandpass filter depending upon which of said first and second radio communication formats is selected;

a fixed-gain IF amplifier which may he selectably paired with the second IF bandpass filter for amplifying an output signal of the second IF bandpass filter, depending upon which of said first and second radio communication forms is selected;

wherein a selected pairing provides optimal intermodulation characteristics of an IF amplification stage.

4. The radio communication apparatus of claim 2, further comprising:

a second wide-band radio communication format which may be selected;

a second IF bandpass filter having a second predetermined pass bandwidth; and means for selectably pairing the variable-gain amplifier with said second IF bandpass filter when said second wide-band radio communication format is selected to provide optimal intermodulation characteristic of an IF amplifier stage.

5. A radio communication apparatus for selectable first, second and third radio communication formats which prescribe first, second and third desired IF pass bandwidths respectively;

a first IF bandpass filter, having a first predetermined pass bandwidth corresponding to the first desired IF pass bandwidth, for filtering signals of the first radio communication format;

a second IF bandpass filter, having a second predetermined pass bandwidth corresponding to the second desired IF pass bandwidth, for filtering signals of the second radio communication format;

a third IF bandpass filter, having a third predetermined pass bandwidth corresponding to the third desired IF pass bandwidth, for filtering signals of the third radio communication format;

a fixed-gain IF amplifier paired with said first IF bandpass filter for processing signals of said first radio communication format;

a variable-gain IF amplifier which may be selectably paired with one of said second and third IF bandpass filters for processing signals of said second and third radio communication formats, depending upon which of said second and third communication formats is selected.

6. The radio communication apparatus of claim 5, wherein said first radio communication format is a narrow-band format, and said second and third radio communication formats are wideband formats.

* * * * *